United States Patent [19]

Kimura et al.

[11] Patent Number: 5,020,715
[45] Date of Patent: Jun. 4, 1991

[54] BONDING METHOD

[75] Inventors: Kazumasa Kimura, Tokyo; Akira Komamiya, Saitama; Takashi Endo, Tokyo, all of Japan

[73] Assignee: Kabushiki Kaisha Shinkawa, Tokyo, Japan

[21] Appl. No.: 474,213

[22] Filed: Feb. 1, 1990

Related U.S. Application Data

[63] Continuation of Ser. No. 289,182, Dec. 22, 1988, abandoned.

[30] Foreign Application Priority Data

Dec. 23, 1987 [JP] Japan .................................. 62-325726

[51] Int. Cl.⁵ ...................... H01L 21/58; B23K 101/36
[52] U.S. Cl. ...................................... 228/102; 228/179
[58] Field of Search ................ 228/102, 7, 6.2, 179

[56] References Cited

U.S. PATENT DOCUMENTS

| | | | |
|---|---|---|---|
| 3,581,375 | 6/1971 | Rottmann | 228/102 |
| 4,479,298 | 10/1984 | Hug | 228/6.2 |
| 4,501,064 | 2/1985 | DiNozzi et al. | 228/6.2 |
| 4,763,827 | 8/1988 | Watanabe et al. | 228/6.2 |

Primary Examiner—Sam Heinrich
Attorney, Agent, or Firm—Koda and Androlia

[57] ABSTRACT

A bonding method including the steps of dividing a substrate into a plurality of regions along its length, storing substrate feeding data and bonding pattern data for the respective regions into a data memory, feeding the substrate underneath a bonding tool in accordance with the substrate feeding data, and then successively performing bonding for the respective regions in accordance with the bonding pattern data.

4 Claims, 2 Drawing Sheets

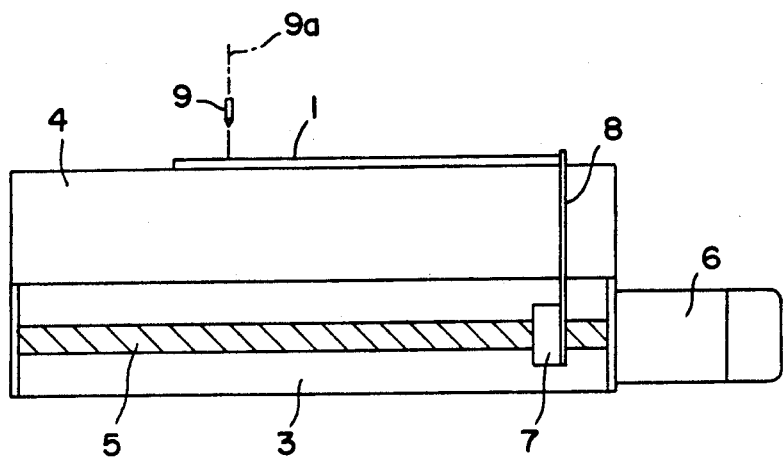
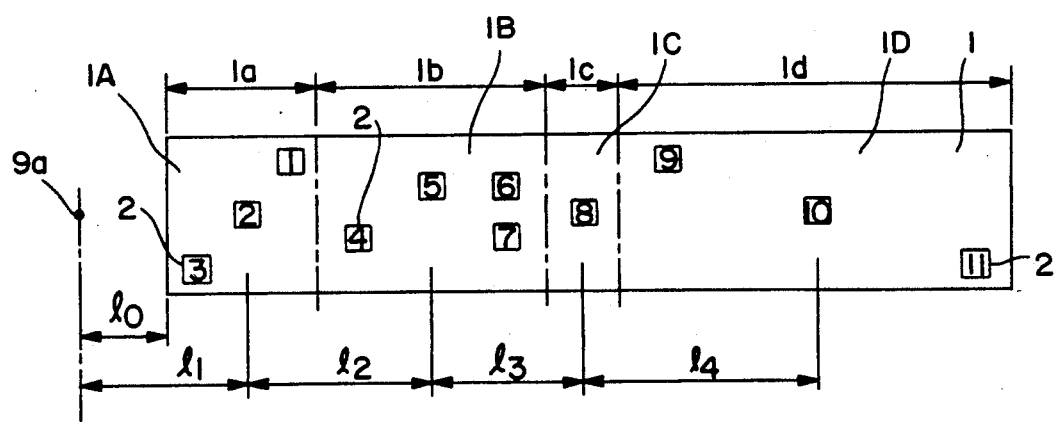

BONDING METHOD

This is a continuation of application Ser. No. 289,182, filed Dec. 22, 1988, now abandoned.

BACKGROUND OF THE INVENTION

1. Field of the Invention

The present invention relates to a bonding method used for wire-bonding, pellet-bonding, etc.

2. Prior Art

Generally, pellet bonding patterns, wire bonding patterns, etc. are designed in advance and then placed at regular intervals on substrates. Accordingly, a single set of substrate feeding data, which feeds the substrate at fixed intervals, and a single set of bonding pattern data are both stored in the data memory of the control section of the bonding apparatus. Bonding is performed for the entire substrate by successively repeating substrate feeding action for a fixed distance, and then bonding is performed based upon a predetermined bonding pattern after the feeding action of the substrate.

Recently, however, as a result of diversification in semiconductor devices, cases have arisen in which pellets are irregularly bonded on substrates, and wires are irregularly bonded between the pellets.

These bondings are performed as follows: A plurality of bonding devices are installed along the feeding path of the substrate, and the substrate is divided into a multiple number of regions. Each of these regions is assigned to and processed by one of bonding devices. In cases where bonding is performed using a single bonding apparatus, bonding is performed manually.

Since the above-described conventional technique requires the use of a multiple number of bonding devices, an extremely large installation space is required, and the apparatus is thus usually expensive. Furthermore, in small-scale production, the efficiency of each bonding device is extremely poor. In addition, it goes without saying that when the bonding is done manually, the productivity is very low.

SUMMARY OF THE INVENTION

Accordingly, the object of the present invention is to provide a bonding method which makes it possible to bond irregular bonding patterns automatically using a single bonding apparatus.

The problems found in the prior art are solved by the method of the present invention which includes the steps of dividing a substrate into a multiple number of regions along the length of the substrate, storing substrate feeding data and bonding pattern data for the respective regions which are obtained from divisions of the substrate in a data memory, feeding the substrate in accordance with such substrate feeding data, and successively performing bonding for the respective regions in accordance with the bonding pattern data for the regions.

In the method of the present invention, the substrate is fed a predetermined distance corresponding to the respective regions into which the substrate is divided, and bonding is performed according to the bonding pattern data for the respective regions. Accordingly, irregular bonding patterns can be easily created using a single bonding apparatus.

BRIEF DESCRIPTION OF THE DRAWINGS

FIG. 1 is a schematic diagram of the working parts of the apparatus using the method of the present invention;

FIG. 3 is an explanatory plan view illustrating an example showing how bonding of various patterns is performed on a substrate.

DETAILED DESCRIPTION OF THE INVENTION

Figure 2:
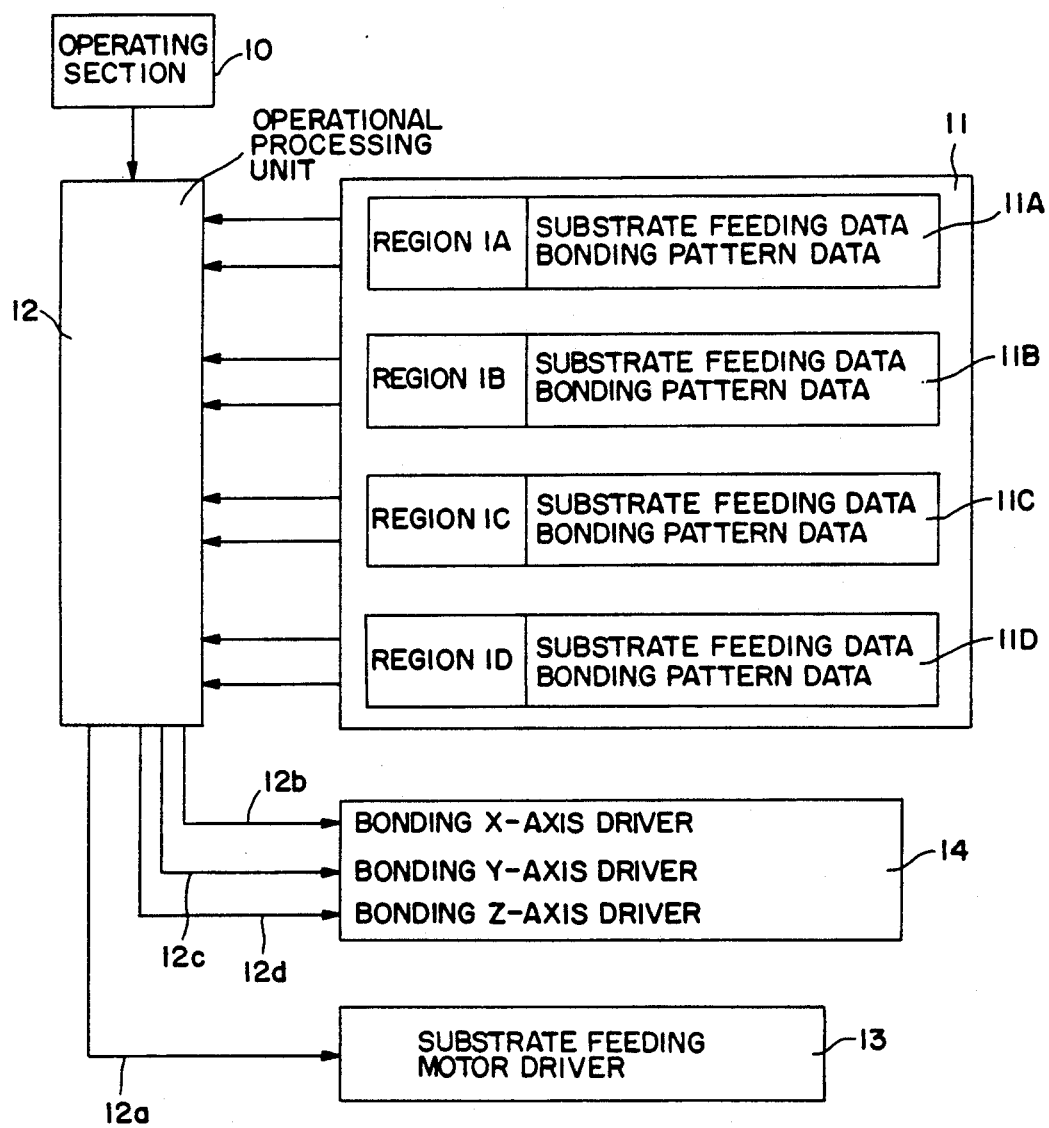
FIG. 2 is a block diagram of a control part thereof.

The present invention will be described with reference to the accompanying drawings, wherein an embodiment for executing wire bonding is used as an example; however, the method of the present invention is also applicable to a pellet-bonding.

As shown in FIG. 1, a heat block 4 is provided on the upper surface of a base 3. This heat block 4 is installed between guide rails (not shown in the Figures) which face each other so that they guide both sides of a substrate. A substrate feeding axle 5 which extends in the feeding direction of the substrate 1 is rotatably supported on the base 3, and one end of this substrate feeding axle 5 is connected to the output shaft of a substrate driving motor 6. A female screw 7 is engaged with the substrate feeding axle 5. A substrate feeding arm 8 is fixed to the female screw 7 and extends to the rear end of the substrate 1. The female screw 7 and the substrate feeding arm 8 can be moved along the axial line of the substrate feeding axle 5 when the axle 5 is rotated. However, it goes without saying that the female screw 7 and the substrate feeding arm 8 are provided so that they cannot rotate by themselves. Since this "stop-rotation" structure is known in the prior art, it is omitted from the Figures.

Reference numeral 9 is a bonding tool of a wire bonding apparatus structured as seen in the prior art and installed above the heat block 4.

The substrate driving motor 6 and an X-axis motor, Y-axis motor and Z-axis motor (not shown in the Figures) used for bonding in the wire bonding apparatus using the method of the present invention are controlled by the control unit illustrated in FIG. 2.

In FIG. 2, reference numeral 10 indicates the operating section of the apparatus.

A data memory 11 stores data, i.e., substrate feeding data and bonding pattern data, which are required for operation of the apparatus and described in detail below. The "bonding pattern data" includes a bonding pattern which designates bonding positions, positional coordinate data of the respective bonding points, etc.

An operational processing unit 12 reads out required data from the data memory 11 in accordance with an operating signal sent from the operating section 10 and then outputs various types of command signals necessary for operation of the apparatus.

A substrate feeding motor driver 13 drives the substrate driving motor 6 in accordance with substrate feeding data signals 12a which are output by the operational processing unit 12.

Reference numeral 14 indicates X-axis, Y-axis and Z-axis drivers which, respectively, drive the X-axis, Y-axis and Z-axis driving motors of the bonding apparatus in accordance with bonding pattern data signals 12b, 12c and 12d which are outputted by the operational processing unit 12. The driving motors move the tool 9 along the X-axis, Y-axis and Z-axis, respectively.

In this embodiment, the data memory 11 consists of four data memory units 11A, 11B, 11C and 11D which are set as follows:

As shown in FIG. 3, the substrate 1 is divided into four regions 1A, 1B, 1C, and 1D. When the substrate 1 is fed, feeding is performed so that the center of one of the respective regions 1A through 1D is positioned directly beneath the standard position 9a of the tool 9. When the distance from the leading edge of the substrate 1 to the standard position 9a is $l_0$, for example, as shown in FIG. 3, before the region 1A of the substrate 1 is fed to a point directly beneath the standard position 9a, and the lengths of the regions 1A, 1B, 1C and 1D are 1a, 1b, 1c and 1d, respectively. Thus, the feeding distance $l_1 = l_0 + 1a/2$, $l_2 = (1a + 1b)/2$, $l_3 = (1b + 1c)/2$, and $l_4 = (1c + 1d)/2$. In other words, the substrate feeding data in the data memory units 11A, 11B, 11C and 11D correspond to the distance $l_1$, $l_2$, $l_3$ and $l_4$, respectively.

The bonding pattern data stored in the data memory unit 11 consists of the data required in order to move the tool 9 along the X-axis, Y-axis and Z-axis so that the pellets 2 in the region 1A, i.e., pellets No. 1, 2 and 3 are wire-bonded. Similarly, the bonding pattern data stored in the data memory units 11B, 11C, and 11D consists of the data required for wire bonding regions 1B, 1C, and 1D, respectively.

Next, operation of the method of the present invention will be described:

When a "start" command is inputted into the apparatus through the operating section 10, the operational processing unit 12 first reads out the substrate feeding data for the region 1A from the memory unit 11A, calculates the required movement distance, and then inputs a signal representing the amount of movement required into the substrate feeding motor driver 13. The substrate driving motor 6 is thus actuated, and the substrate feeding arm 8 is caused to move a distance corresponding to $l_1$ by the substrate feeding screw 5. Accordingly, the center of region 1A of the substrate 1 is positioned directly beneath the standard position 9a.

The operational processing unit 12 then reads out the bonding pattern data for the region 1A from the data memory unit 11A, calculates the required amount of movement, and then inputs signals representing the amount of movement into the bonding X-axis, Y-axis and Z-axis drivers 14. As a result, the tool 9 is moved along the X-axis, Y-axis and Z-axis, and wire bonding is performed for all of the pellets 2 placed in the region 1A, i.e., pellets No. 1, 2 and 3 by a method existing in prior art.

When wire bonding in region 1A is completed, the data memory unit 11B for region 1B is then read in the same manner as described above, and the substrate 1 is fed by an amount corresponding to $l_2$. Then, wire bonding is performed for all of the pellets 2 placed in the region 1B, i.e., pellets No. 4, 5, 6 and 7. Afterward, wire bonding is successively performed in the same manner in regions 1C and 1D.

As is clear from the above description, according to the present invention, irregular bonding patterns can be automatically bonded using a single bonding apparatus.

We claim:

1. A bonding method for irregular bonding patterns characterized in that said method comprises the steps of:
   dividing a substrate into a plurality of regions along its length, each of said plurality of regions having a plurality of pellets to be placed therein;
   storing substrate feeding data and bonding pattern data for each of the plurality of regions of said substrate into a data memory, said substrate feeding data and said bonding pattern data for each of said plurality of regions being different;
   feeding said substrate in accordance with said substrate feeding data for each of said plurality of bonding regions such that a center of each of said plurality of regions is placed beneath a bonding tool; and
   performing bonding pattern operations successively for each of the plurality of regions in accordance with said bonding pattern data for each of said plurality of regions to place each of plurality of pellets in each of said plurality of regions;
   whereby a plurality of pellets are placed in each of said plurality of regions.

2. A bonding method according to claim 1, wherein said pattern bonding is a wire-bonding process.

3. A bonding method according to claim 1, wherein said pattern bonding is a pellet-bonding process.

4. A bonding method according to claim 1, wherein said substrate is fed a distance $l_i$ for each of said plurality of regions to place said bonding tool above a center of each of said plurality of regions and wherein the distance $l_i$ for each of the plurality of regions is equal to one half of a sum of a length of a region where the bonding tool is to be placed above the center thereof and a length of previous region.

* * * * *